United States Patent
Risk et al.

(10) Patent No.: US 7,224,638 B1
(45) Date of Patent: May 29, 2007

(54) RELIABILITY CLOCK DOMAIN CROSSING

(75) Inventors: Gabriel C. Risk, Palo Alto, CA (US);
Leandro A. Chua, Jr., Santa Clara, CA (US); Drew G. Doblar, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 11/304,166

(22) Filed: Dec. 15, 2005

(51) Int. Cl.
*G11C 8/00* (2006.01)

(52) U.S. Cl. .................. 365/233; 365/230.03; 365/236
(58) Field of Classification Search ................ 365/233, 365/230.03, 236
See application file for complete search history.

(56) References Cited

U.S. PATENT DOCUMENTS

| | | | |
|---|---|---|---|
| 5,661,732 A | 8/1997 | Lo et al. | |
| 5,825,785 A | 10/1998 | Barr et al. | |
| 5,982,189 A | 11/1999 | Motika et al. | |
| 5,987,635 A | 11/1999 | Kishi et al. | |
| 5,995,443 A * | 11/1999 | Farmwald et al. | 365/233 |
| 6,085,346 A | 7/2000 | Lepejian et al. | |
| 6,148,426 A | 11/2000 | Kim et al. | |
| 6,205,564 B1 | 3/2001 | Kim et al. | |
| 6,249,893 B1 | 6/2001 | Rajsuman et al. | |
| 6,310,814 B1 * | 10/2001 | Hampel et al. | 365/230.03 |
| 6,330,645 B1 | 12/2001 | Harriman | |
| 6,442,723 B1 | 8/2002 | Koprowski et al. | |
| 6,560,740 B1 | 5/2003 | Zuraski, Jr. et al. | |
| 6,587,979 B1 | 7/2003 | Kraus et al. | |
| 6,603,706 B1 | 8/2003 | Nystuen et al. | |
| 6,636,997 B1 | 10/2003 | Wong et al. | |
| 6,654,920 B1 | 11/2003 | Hetherington et al. | |
| 6,658,611 B1 | 12/2003 | Jun | |
| 6,658,617 B1 | 12/2003 | Wong | |
| 6,661,266 B1 | 12/2003 | Variyam et al. | |
| 6,665,828 B1 | 12/2003 | Arimilli et al. | |
| 6,671,838 B1 | 12/2003 | Koprowski et al. | |
| 6,681,337 B1 | 1/2004 | Smith et al. | |
| 6,681,359 B1 | 1/2004 | Au et al. | |
| 6,684,358 B1 | 1/2004 | Rajski et al. | |
| 6,819,730 B2 | 11/2004 | He | |
| 6,901,543 B2 | 5/2005 | Dorsey | |

(Continued)

FOREIGN PATENT DOCUMENTS

EP 0848329 6/1998

*Primary Examiner*—Huan Hoang
(74) *Attorney, Agent, or Firm*—Meyertons Hood Kivlin Kowert & Goetzel, P.C.; Rory D. Rankin

(57) ABSTRACT

A data communications system is disclosed. The data communications system comprises two clock domains. A first clock domain includes a transmitter and a first clock signal. A second clock domain includes a receiver and a second clock signal. The transmitter conveys the first clock signal and a data signal to the receiver. The receiver: (a) counts a first number of transitions of the second clock signal in response to detecting a transition of the first clock signal; (b) maintains a first count of the number of transitions of the second clock signal; (c) samples the data signal and maintains a second count of the number of transitions of the second clock signal in response to detecting the first count equals a first pre-determined value; and (d) samples the data signal and resets the second count in response to detecting the second count equals a second pre-determined value.

20 Claims, 6 Drawing Sheets

U.S. PATENT DOCUMENTS

| | | |
|---|---|---|
| 6,918,016 B1 | 7/2005 | Magro |
| 6,981,191 B2 | 12/2005 | Dorsey |
| 6,996,760 B2 | 2/2006 | Dorsey |
| 2003/0074618 A1 | 4/2003 | Dorsey |
| 2003/0074619 A1 | 4/2003 | Dorsey |
| 2003/0074620 A1 | 4/2003 | Dorsey |
| 2004/0012577 A1 | 1/2004 | Naegle et al. |

* cited by examiner

RELIABILITY CLOCK DOMAIN CROSSING

BACKGROUND OF THE INVENTION

1. Field of the Invention

This invention relates to digital data communication and, more particularly, to reliable communication of digital data between different clock domains.

2. Description of the Related Art

New techniques to ensure the reliability of the communication of digital data have become necessary as the speed of communication links has increased. Particularly within computer memory systems, a reference clock may accompany parallel digital data so as to provide a mechanism for determining the appropriate time to sample the data. However, it is often the case that multiple clock domains are established within a given communications system due to the difficulties involved in distributing a single clock throughout a large system. Although the clocks of each individual clock domain may have the same frequency, it is to be expected that the phase relationship between any two clocks in different domains will vary depending on changes in voltages and temperature between the domains over time. Jitter in the phase offset between a transmitting clock and a receiving clock tends to move the sampling point away from the ideal point in the received data signal, resulting in poor timing margins and/or a higher bit-error-rate (BER). The higher the speed at which a communications link is clocked, the more significant the effects of phase jitter become. Therefore, it is desirable to have a mechanism to determine when to sample the data at the receiver while maintaining a robust time margin thereby reducing the impact of phase changes between clock domains and enabling higher communication speeds.

In addition to the above considerations, the use of serial communication links to convey digital data within computer memory subsystems has become commonplace. For example, banks of fully buffered dual inline memory modules (FB-DIMMs), which may be used to provide increased memory capacity in computer systems, are commonly connected to each other via a serial ring bus. Each serial link in the ring bus may be equipped with a serializer/deserializer (SerDes) device whose serialization function converts parallel data from within the FB-DIMM to serial data for transmission on the ring bus. A typical SerDes includes a shift register for this purpose. The clock that clocks the shift register may be part of a different clock domain than the clock that clocks the parallel data within the FB-DIMM. It is desirable for the shift register to be loaded at a time that is near the midpoint of the parallel data clock to provide for adequate timing margin. It is also desirable for the shift register to be loaded at a time after the last bit of a parallel data sample has been shifted out so as to preserve frame alignment in the serial data. Accordingly, what is needed is a technique for simultaneously satisfying the constraints of sampling parallel data with adequate time margin and synchronization of the shift register's load time and serial clock.

SUMMARY OF THE INVENTION

Various embodiments of a data communications system are disclosed. In one embodiment, the data communications system comprises two clock domains. A first clock domain includes a transmitter and a first clock signal. A second clock domain includes a receiver and a second clock signal. The transmitter is configured to convey the first clock signal and a data signal to the receiver. The receiver is configured to: (a) count a first number of transitions of the second clock signal in response to detecting a transition of the first clock signal; (b) maintain a first count of the number of transitions of the second clock signal; (c) sample the data signal and maintain a second count of the number of transitions of the second clock signal in response to detecting the first count equals a first pre-determined value; and (d) sample the data signal and reset the second count in response to detecting the second count equals a second pre-determined value.

In a further embodiment, the receiver is further configured to repeatedly sample the data signal and reset the second count in response to detecting the second count equals a second pre-determined value until the receiver receives a reset command. In a still further embodiment, the data signal comprises a series of multi-bit, parallel data samples. To sample the data signal, the receiver is configured to load a sample of the data signal into a shift register. The receiver is further configured to shift a bit from the shift register at the timing of each of a rising edge transition and a falling edge transition of the second clock signal.

Figure 1:
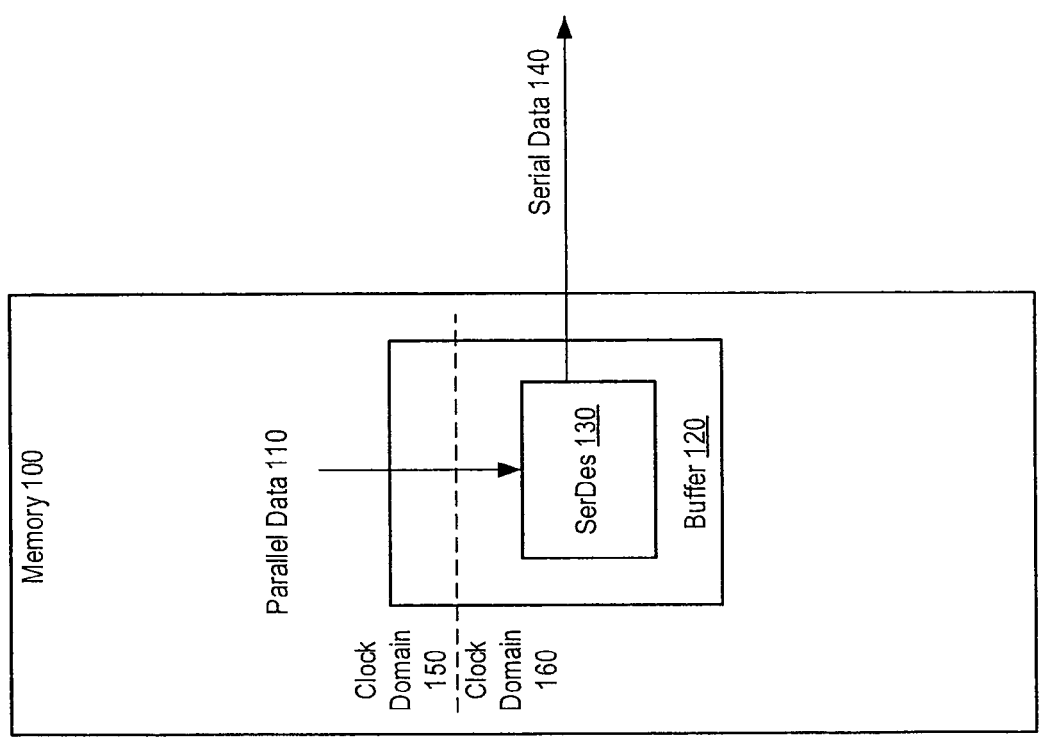
FIG. 1 is a generalized block diagram of one embodiment of a memory module having two clock domains.

While the invention is susceptible to various modifications and alternative forms, specific embodiments are shown by way of example in the drawings and are herein described in detail. It should be understood, however, that drawings and detailed descriptions thereto are not intended to limit the invention to the particular form disclosed, but on the contrary, the invention is to cover all modifications, equivalents and alternatives falling within the spirit and scope of the present invention as defined by the appended claims.

DETAILED DESCRIPTION

FIG. 1 is a generalized block diagram of one embodiment of a memory module 100 having two clock domains. In the illustrated embodiment, memory module 100 holds parallel data 110, and includes a buffer 120 having a serializer/deserializer (SerDes) 130 for converting parallel data 110 to a serial data 140 stream of bits. In operation, parallel data is clocked in a first clock domain 150 and conveyed as a parallel word across a clock domain boundary to SerDes 130. SerDes 130 operates in a second clock domain 160 to convert parallel data 100 to serial data 140. The output of serial data 140 is controlled by a serial clock within clock domain 160.

Within memory module 100, data may be processed as a set of parallel bits. For example, in one embodiment, memory module 100 may be an FB-DIMM in which 12-bit data words are moved synchronously and in parallel from location to location according to a parallel clock signal. Before these 12-bit words may be transmitted from memory module 100 as serial data 140, the data may be converted to a serial bit stream that is clocked by a serial clock signal. The frequencies of the parallel and serial clock signals may be related by a ratio that depends on the design of the memory module. For example, in FB-DIMM systems, bits of data are clocked on both the rising and falling edge of the serial clock. Consequently a unit interval (UI) may be defined to be one half the clock period of the serial clock. Accordingly, the ratio of the frequency of the serial clock to that of the parallel clock is 6-to-1 in an FB-DIMM system. One consequence of the fact that the parallel and serial clock signals may be generated in separate clock domains is that the phase relationship between them may vary due to changes in voltage and temperature between the respective clock domains. The discussion that follows includes a detailed description of methods and circuitry that may be used to accommodate the phase differences between the parallel and serial clock signals.

Figure 2:
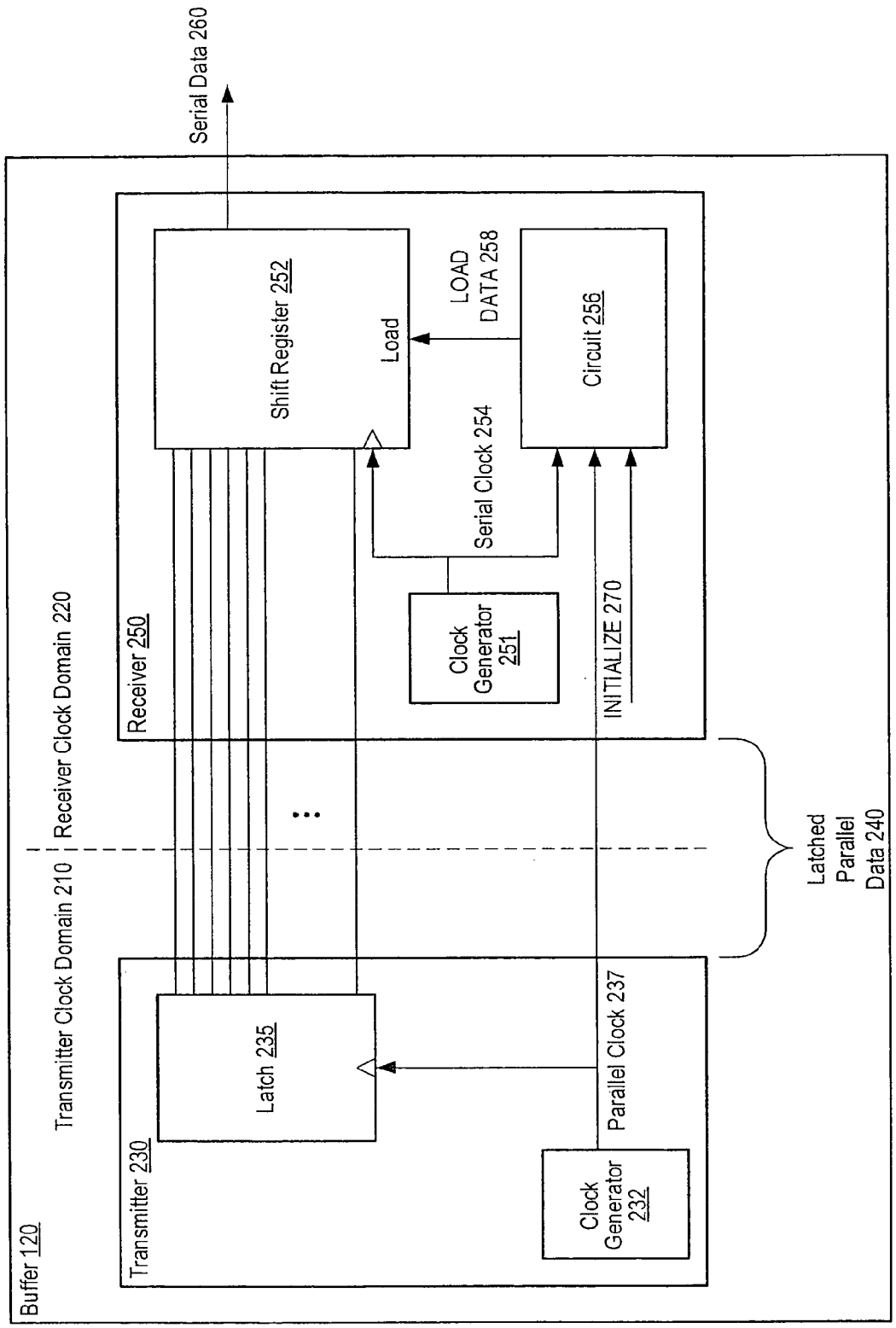
FIG. 2 is a generalized block diagram of one embodiment of a memory buffer that includes more than one clock domain

FIG. 2 is a generalized block diagram of one embodiment of a memory buffer 120 that includes more than one clock domain. In the embodiment shown, parallel digital data may be communicated from a transmitter clock domain 210 to a receiver clock domain 220. Clock domain 210 may include a transmitter 230 that transmits latched parallel data 240 to clock domain 220. Clock domain 220 may include a receiver 250.

Transmitter 230 may include a latch 235 and a parallel clock 237. Receiver 250 may include a shift register 252, a serial clock 254, and a circuit 256. In operation, parallel clock 237 may be used to clock latch 235 so that each bit of parallel data 240 transmitted between the clock domains changes at the same time. Serial clock 254 and parallel clock 237 may be combined within circuit 256 to produce a LOAD DATA 258 signal. LOAD DATA 258 may be coupled to the "load" input of shift register 252. When LOAD DATA 258 is asserted, all of the bits of parallel data 240 may be sampled at the same time and stored in shift register 252. Subsequently, parallel data 240 may be converted to a serial data 260 output by the action of serial clock 254 clocking shift register 252. One objective of receiver 250 may be to produce the LOAD DATA 258 signal at a time with respect to parallel clock 237 that provides reliable sampling of parallel data 240. Another objective of receiver 250 may be to produce the LOAD DATA 258 signal at a time with respect to serial clock 254 that ensures that all of the bits from the sample that was previously loaded into shift register 252 have been clocked out before the subsequent sample of parallel data 240 is loaded. A detailed discussion of the apparatus and method for accomplishing these two objectives is provided below.

Figure 3:
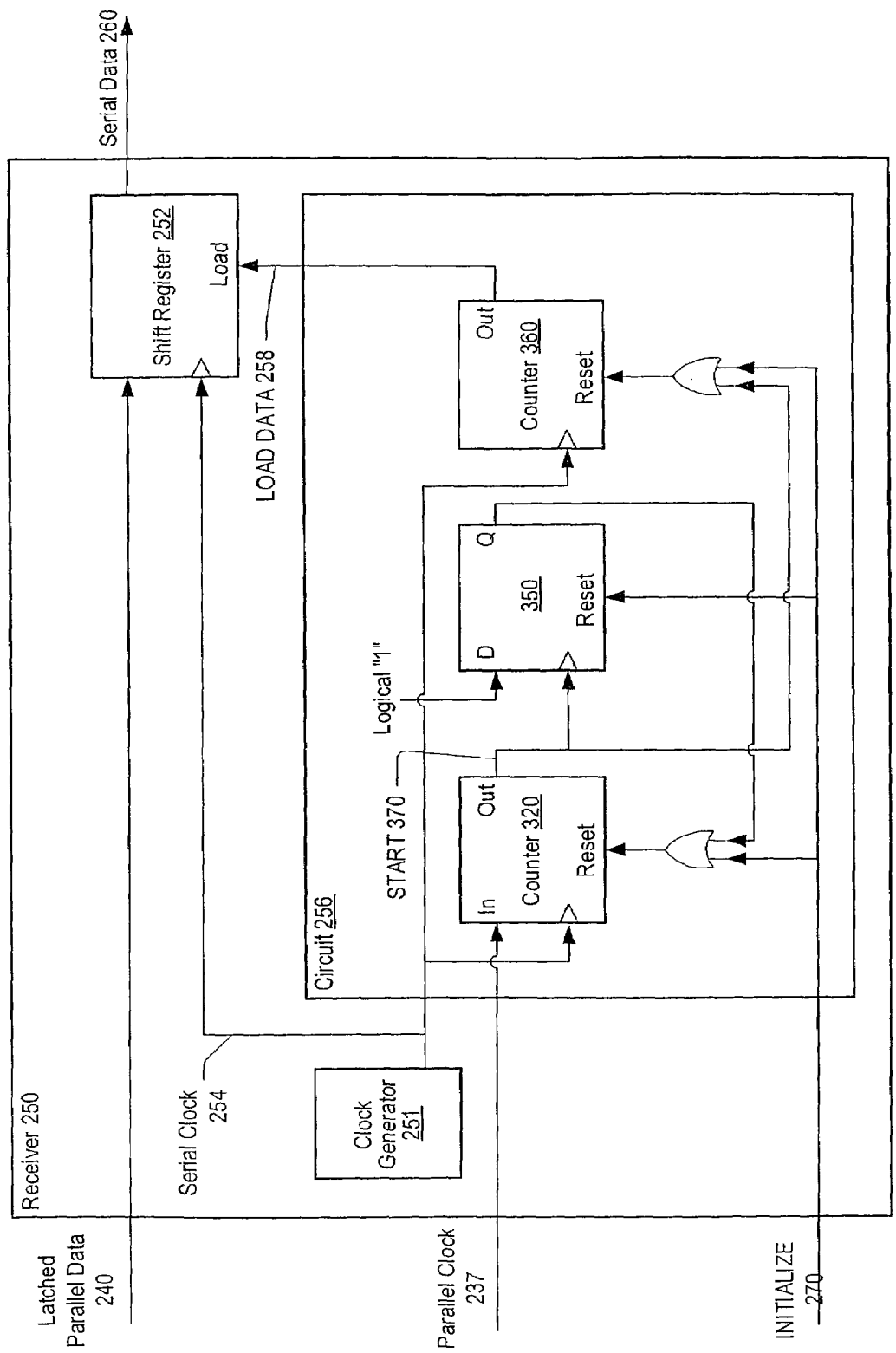
FIG. 3 is a detailed block diagram of a receiver including one embodiment of a circuit for controlling clocks across two clock domains.

FIG. 3 is a detailed block diagram of a receiver 250 including one embodiment of a circuit 256 for controlling clocks across two clock domains. In the illustrated embodiment, circuit 256 includes a counter 320, a D flip-flop 350 and a counter 360. Serial clock 254 is coupled to the clock input of counter 320 and counter 360. Parallel clock 237 is coupled to the input of counter 320. The output of counter 320 is coupled to the clock input of flip-flop 350. The D input of flip-flop 350 is coupled to a logical "1". The reset input of counter 320 is coupled to the logical "OR" of INITIALIZE 270 and the output of flip-flop 350. The reset input of counter 360 is coupled to the logical "OR" of INITIALIZE 270 and the output of counter 320.

At the beginning of operation, such as upon power-up of memory subsystem 100, a reset pulse may be asserted via INITIALIZE 270. Assertion of INITIALIZE 270 may clear Q outputs of counter 320 and flip-flop 350 as well as setting the count of counter 360 to zero. After the reset pulse on INITIALIZE 270 returns to zero, subsequent rising edges of serial clock 254 may load the state of parallel clock 237 into counter 320. On the first rising edge of serial clock 254 after the first rising edge of parallel clock 237, counter 320 may begin counting. When counter 320 reaches a pre-determined value, the output of counter 320 may transition from "0" to "1". The output of counter 320 may comprise a START 370 signal. The pre-determined value to which counter 320 counts may be set according to the internal architecture of memory 100. For example, for an FB-DIMM the ratio of the serial clock frequency to that of the parallel clock is 6-to-1. It is noted that the third rising edge of serial clock 254 after the first rising edge of parallel clock 237 occurs close to the midpoint of the parallel clock 237 cycle. Consequently, the selection of a pre-determined value of three may provide a sampling point for START 370 that results in a favorable time margin. In alternative embodiments, a different number of rising edges of serial clock 254 may be counted to produce a START 370 signal. For example, the second or fourth rising edge of serial clock 254 after the first rising edge of parallel clock 237 may be selected as a START 370 signal, depending on the desired timing margin in sampling parallel data 240, the desire to simplify circuit 256, tolerance to phase jitter, and other design considerations, as desired.

A rising edge of START 370 may trigger flip-flop 350 to output a logical "1" signal, thereby disabling counter 320. Counter 320 may remain in a reset state until the next reset pulse on INITIALIZE 270 clears the output of flip-flop 350. The rising edge of START 370 also resets counter 360. Once the output of counter 320 is reset by flip-flop 350, counter 360 may begin counting.

Counter 360 may be configured to count the number of cycles of serial clock 254 in one cycle of parallel clock 237. For example, for an FB-DIMM, counter 360 may be configured to count to six. Once counter 360 reaches its target count, a LOAD DATA 258 pulse may be issued. In one embodiment of receiver 250, LOAD DATA 258 may be coupled to the load input of shift register 252. Accordingly, LOAD DATA 258 may cause shift register 252 to sample latched parallel data 240 near the midpoint of parallel clock 237.

In the embodiment described above, shift register 252 and circuit 256 have been described as including individual digital logic components such as D flip-flops and counters. In alternative embodiments, shift register 252 and circuit 256 may be constructed from discreet logic gates or as part of a single integrated circuit, an FPGA, or other programmable logic circuit, as desired. In one embodiment, receiver 250 may be fabricated on a single integrated circuit chip.

Figure 4:
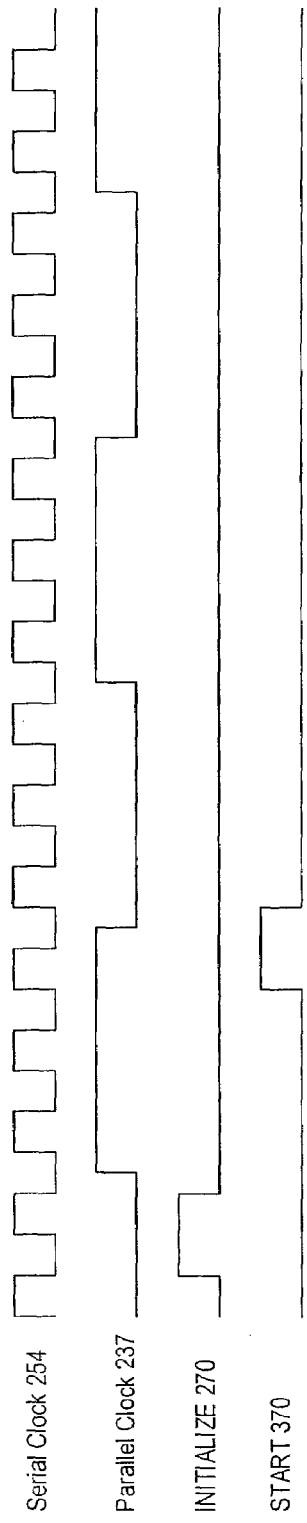
FIG. 4 illustrates the timing of signals within one embodiment of memory buffer during the initialization of a circuit for controlling clocks across two clock domains.

FIG. 4 illustrates the timing of signals within one embodiment of memory buffer 120 during the initialization of circuit 256. In the illustrated embodiment, serial clock 254 may operate at a frequency 6 times greater than that of parallel clock 237. There may be a phase offset between parallel clock 237 and serial clock 254. After power is applied to memory subsystem 100, an INITIALIZE 270 pulse may be issued. On the third rising edge of serial clock 254 after the next rising edge of parallel clock 237, a START 370 pulse may be issued.

Figure 5:
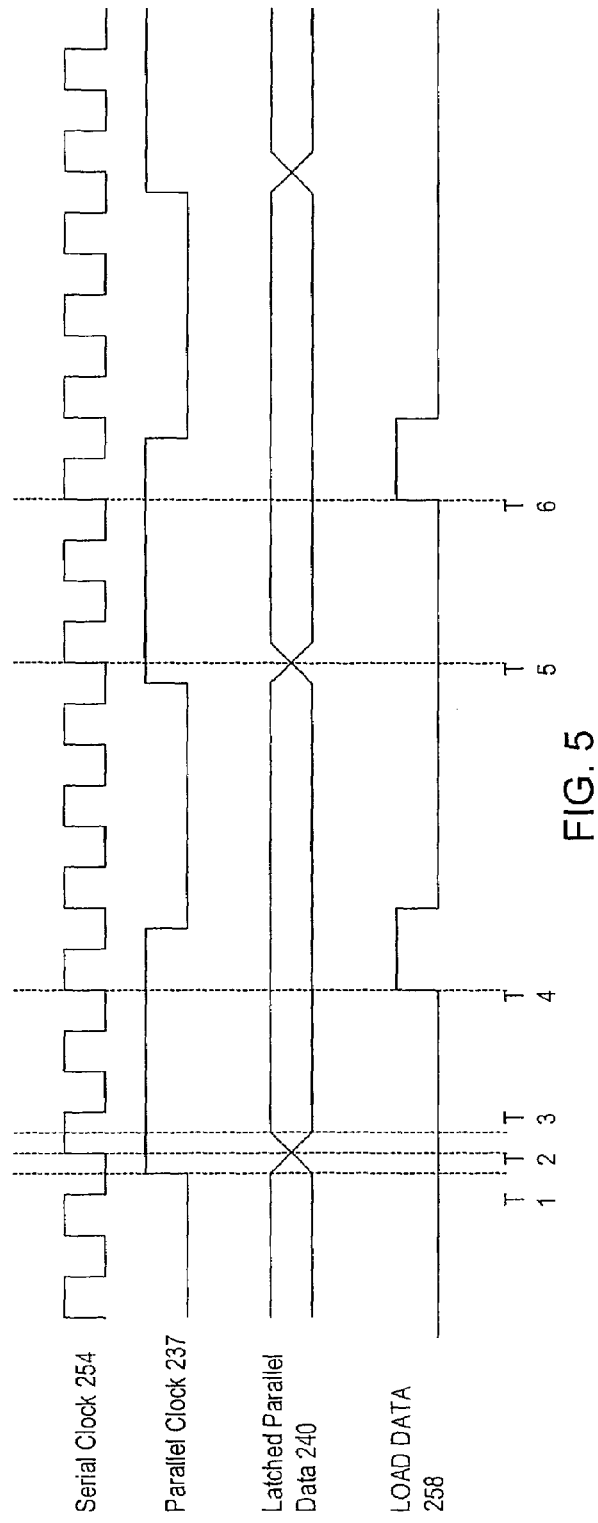
FIG. 5 illustrates the timing of signals within one embodiment of memory buffer during the steady state operation of a circuit for controlling clocks across two clock domains.

FIG. 5 illustrates the timing of signals within one embodiment of memory buffer 120 during the steady state operation of circuit 256. T1 illustrates a rising edge of parallel clock 237. T2 illustrates a first transition point of latched parallel data 240. T3 illustrates the time at which latched parallel data 240 has settled to a new value after a transition. T4 illustrates the time at which a first LOAD DATA 258 samples latched parallel data 240. T5 illustrates a second transition point of latched parallel data 240. T6 illustrates the time at which a second LOAD DATA 258 samples latched parallel data 240. It may be desirable for T4 to occur near the midpoint between T2 and T5.

As shown, latched parallel data 240 changes after each rising edge of parallel clock 237. LOAD DATA 258 is timed to sample latched parallel data 240 near the midpoint of parallel clock 237. Specifically, LOAD DATA 258 occurs on the third rising edge of serial clock 254 after the rising edge of parallel clock 237. It is noted that the timing of LOAD DATA 258 with respect to parallel clock 237 that is shown illustrates the timing relationship that may occur immediately after initialization of circuit 256. However, as the phase relationship between parallel clock 237 and serial clock 254 changes, the relationship between LOAD DATA 258 and serial clock 254 may remain fixed. Specifically, LOAD DATA 258 may occur every six cycles of serial clock 254, regardless of the jitter in the relative phase between parallel clock 237 and serial clock 254. As long as the relative phase change is less than the time interval between the initial location of LOAD DATA 258 and the nearest transition point of latched parallel data 240, the timing margin for sampling latched parallel data 240 will not be violated. If a greater phase change occurs and a sampling error results, circuit 256 may be reset by an operator issuing an INITIALIZE 270 pulse.

Figure 6:
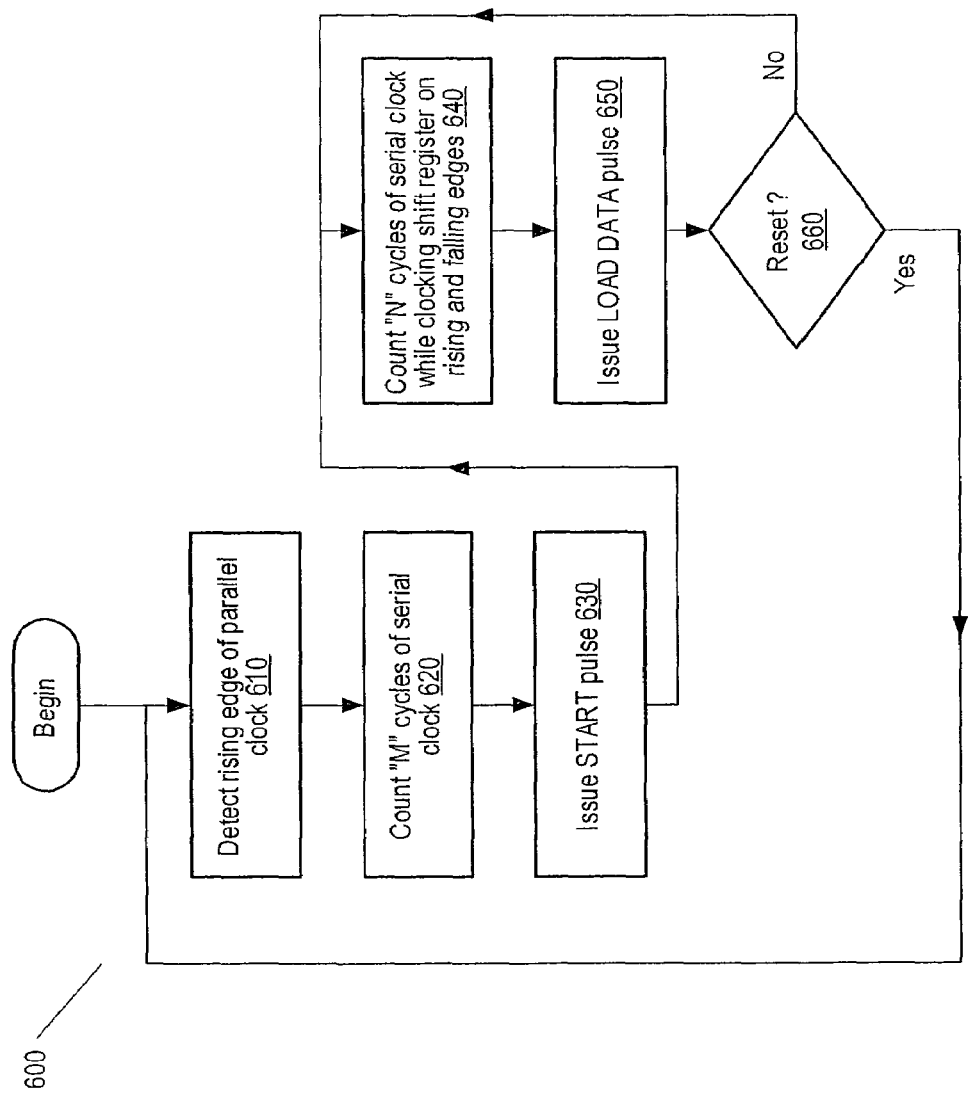
FIG. 6 illustrates one embodiment of a process that may be executed to control clocks across two clock domains.

FIG. 6 illustrates one embodiment of a process 600 that may be executed to control clocks across two clock domains. At the beginning of process 600 a rising edge of parallel clock 237 is detected (block 610). Once the rising edge of parallel clock 237 has been detected, "M" cycles of serial clock 254 may be counted, which is equivalent to 2×M unit intervals (block 620). The value of "M" may be selected to place START 370 near the midpoint of parallel clock 237 to improve timing margin. For example, if latched parallel data 240 contains 12 bits (as it may in an FB-DIMM), then a value of "M" between 2 and 4 inclusive may be selected to provide for adequate timing margin. After "M" cycles of serial clock 254 have elapsed, a START 370 may be issued (block 630). START 360 may begin a loop comprising blocks 640, 650, and 660. In block 640, "N" cycles of serial clock 254 may be counted, where 2×N is the number of bits contained in one sample of parallel data 240. For example, if latched parallel data 240 contains 12 bits, then a value of "N" equal to six may be selected to provide enough clock cycles to empty shift register 252 before the next LOAD DATA 258. At the end of "N" cycles of serial clock 254, a LOAD DATA 258 (block 650) may be issued. After LOAD DATA 258 has been issued, a check may be performed to see if a reset has been requested (decision block 660). If a reset has been requested, process 600 may be restarted at the beginning (block 610). If a reset has not been requested, a count of "N" cycles of serial clock 254 may be restarted (block 640).

Figure 7:
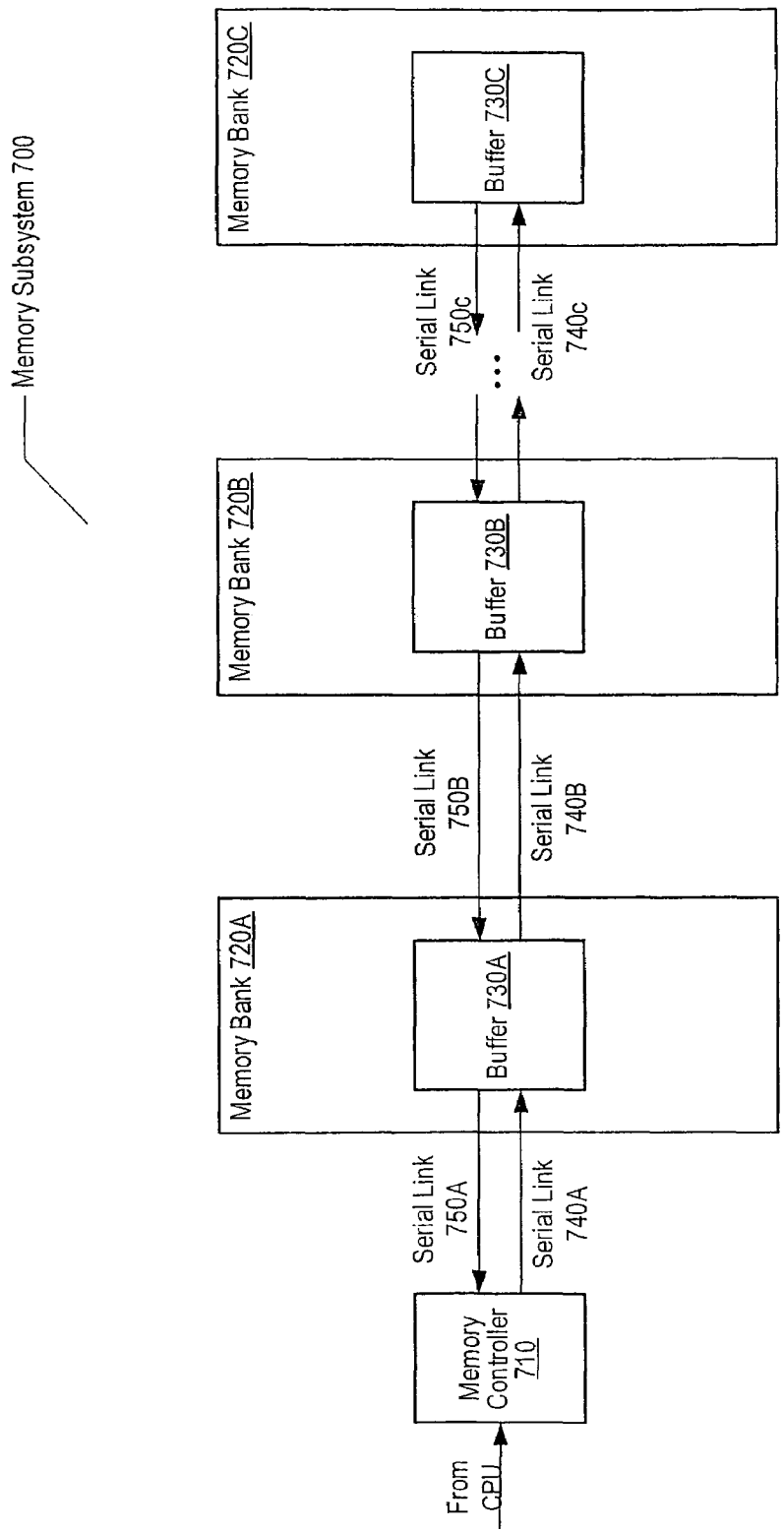
FIG. 7 is a generalized block diagram of a memory subsystem that may be found in a variety of computer systems.

FIG. 7 is a generalized block diagram of a memory subsystem 700 that may be found in a variety of computer systems. In one embodiment, memory subsystem 700 may incorporate the clock synchronization techniques described above. More specifically, memory subsystem 700 includes a memory controller 710 and a series of FB-DIMM memory banks 720A–720C, each of which includes a respective buffer 730A–730C. For ease of discussion, memory banks 720 may refer to any of memory banks 720A–720C and buffers 730 may refer to any of buffers 730A–730C. Although only three memory banks 720 are illustrated, memory subsystem 700 may include more than or fewer than three memory banks 720. Memory controller 710 may be coupled to buffers 730 through a pair of serial links 740A and 750A. Additional serial links 740B, 740C, 750B, and 750C interconnect buffers 730, forming a serial ring bus. A CPU may be coupled to memory banks 720 through memory controller 710.

In operation, data may be communicated between the CPU and any of memory banks 720 via the serial ring bus. For example, during a write operation, memory controller 710 may transmit address and data information on serial link 740A to buffer 730A. Buffer 730 may then decode the address information. If the destination address is within memory bank 720A, the received data is written to the memory location corresponding to the destination address. If the destination address is not within memory bank 720A, the received data is transmitted via serial link 740B to buffer 730B. The process of decoding the destination address to determine whether to write or forward the received data may be repeated for each of buffers 730 until the desired destination address is reached. Similarly, during a read operation, memory controller 710 may transmit address information on serial link 740A to buffer 730A. Buffer 730 may then decode the address information. If the source address is within memory bank 720A, the requested data is read from the memory location corresponding to the source address and transmitted to memory controller 710 via serial link 750A. If the source address is not within memory bank 720A, the address information is transmitted via serial link 740B to buffer 730B. The process of decoding the source address to determine whether to read the requested data or forward the address information may be repeated for each of buffers 730 until the desired source address is reached.

In one embodiment, when parallel data is read from one of memory banks 720, say memory bank 720A, to be converted to serial data for transmission on serial link 740A, it may cross a clock domain boundary within buffer 730A. Within an FB-DIMMs, buffer 730A may conform to a standard architecture such as the Advanced Memory Buffer (AMB). The methods and circuitry previously described may be employed to accommodate the phase differences between the parallel and serial clock signals that are encountered in crossing the clock domain boundary.

In alternative embodiments, parallel data may originate in any of a variety of memory systems such as DRAM, SDRAM, DDR SDRAM, SRAM, PROM or disk storage. In further alternative embodiments, parallel data may cross a clock domain boundary and be converted to serial data within any of a variety of interface circuits suitable to transmit serial data on a serial link. Examples of such serial links commonly used in computer memory and I/O systems include the PCI Express bus, the HyperTransport bus, a RapidIO interconnect, and the Serial ATA bus.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data communications system comprising:
    a first clock domain including a transmitter and a first clock signal; and
    a second clock domain including a receiver and a second clock signal;
    wherein the transmitter is configured to convey the first clock signal and a data signal to the receiver;
    wherein the receiver is configured to:
        (a) count a first number of transitions of the second clock signal in response to detecting a transition of the first clock signal;
        (b) maintain a first count of the number of transitions of the second clock signal;
        (c) sample the data signal and maintain a second count of the number of transitions of the second clock signal in response to detecting the first count equals a first pre-determined value;
        (d) sample the data signal and reset the second count in response to detecting the second count equals a second pre-determined value.

2. The system of claim 1, wherein the receiver is further configured to repeat step (d) until the receiver receives a reset command.

3. The system of claim 1, wherein the first pre-determined value is an integer greater than two and less than the second pre-determined value minus two.

4. The system of claim 1, wherein the data signal comprises a series of multi-bit, parallel data samples.

5. The system of claim 4,
    wherein to sample the data signal, the receiver is configured to load a sample of the data signal into a shift register; and
    wherein the receiver is further configured to shift a bit from the shift register at the timing of each of a rising edge transition and a falling edge transition of the second clock signal.

6. A system comprising a plurality of memory banks interconnected via a serial ring bus, wherein each memory bank includes a data communications system comprising:
    a first clock domain including a transmitter and a first clock signal; and
    a second clock domain including a receiver and a second clock signal;
    wherein the transmitter is configured to convey the first clock signal and a data signal to the receiver;
    wherein the receiver is configured to:
        (a) count a first number of transitions of the second clock signal in response to detecting a transition of the first clock signal;
        (b) maintain a first count of the number of transitions of the second clock signal;
        (c) sample the data signal and maintain a second count of the number of transitions of the second clock signal in response to detecting the first count equals a first pre-determined value;
        (d) sample the data signal and reset the second count in response to detecting the second count equals a second pre-determined value;
    wherein the data signal comprises a series of multi-bit, parallel data samples;
    wherein to sample the data signal, the receiver is configured to load a sample of the data signal into a shift register; and
    wherein the receiver is further configured to shift a bit from the shift register onto the serial ring bus at the timing of each of a rising edge transition and a falling edge transition of the second clock signal.

7. The system of claim 6, wherein each memory bank comprises one of:
    a fully buffered dual inline memory module (FB-DMM);
    a synchronous dynamic random access memory (SDRAM); and
    a double data rate dynamic random access memory (DDR DRAM).

8. The system of claim 6, wherein the serial ring bus comprises a plurality of serial links, each serial link comprising one of:
    a PCI Express bus;
    a HyperTransport bus; and
    a RapidIO interconnect.

9. A method of transmitting data from a first clock domain to a second clock domain, the method comprising:
    conveying a first clock signal from the first clock domain to the second clock domain;
    conveying a data signal from the first clock domain to the second clock domain;
    in the second clock domain:
        (a) counting a first number of transitions of a second clock signal in response to detecting a transition of the first clock signal;
        (b) maintaining a first count of the number of transitions of the second clock signal;
        (c) sampling the data signal and maintaining a second count of the number of transitions of the second clock signal in response to detecting the first count equals a first predetermined value:
        (d) sampling the data signal and resetting the second count in response to detecting the second count equals a second pre-determined value.

10. The method of claim 9, further comprising repeating step (d) until a reset command is received in the second clock domain.

11. The method of claim 9, wherein the first pre-determined value is an integer greater than two and less than the second pre-determined value minus two.

12. The method of claim 9, wherein the data signal comprises a series of multi-bit, parallel data samples.

13. The method of claim 12, wherein sampling the data signal comprises loading a sample of the data signal into a shift register, the method further comprising shifting a bit from the shift register at the timing of each of a rising edge transition and a falling edge transition of the second clock signal.

14. The method of claim 13, wherein the shift register is further configured to shift data onto a serial ring bus interconnecting a plurality of memory banks, wherein each memory bank comprises a fully buffered dual inline memory module (FB-DIMM).

15. A data receiver operable to receive a first clock signal and data signal, the data receiver comprising a second clock signal and configured to:
    (a) count a first number of transitions of the second clock signal in response to detecting a transition of the first clock signal;
    (b) maintain a first count of the number of transitions of the second clock signal;
    (c) sample the data signal and maintain a second count of the number of transitions of the second clock signal in response to detecting the first count equals a first pre-determined value;

(d) sample the data signal and reset the second count in response to detecting the second count equals a second pre-determined value.

16. The data receiver of claim 15, wherein the receiver is further configured to repeat step (d) until the receiver receives a reset command.

17. The data receiver of claim 15, wherein the first pre-determined value is an integer greater than two and less than the second pre-determined value minus two.

18. The data receiver of claim 15, wherein the data signal comprises a series of multi-bit, parallel data samples.

19. The data receiver of claim 18,
wherein to sample the data signal, the receiver is configured to load a sample of the data signal into a shift register; and
wherein the receiver is further configured to shift a bit from the shift register at the timing of each of a rising edge transition and a falling edge transition of the second clock signal.

20. The data receiver of claim 19, wherein the shift register is further configured to shift data onto a serial ring bus interconnecting a plurality of memory banks, wherein each memory bank comprises a fully buffered dual inline memory module (FB-DIMM).

* * * * *